United States Patent [19]
Sawazaki et al.

[11] Patent Number: 5,662,091
[45] Date of Patent: Sep. 2, 1997

[54] IGNITION APPARATUS FOR INTERNAL COMBUSTION ENGINE

[75] Inventors: Nobuyuki Sawazaki; Mitsuru Koiwa; Shigemi Murata, all of Tokyo, Japan

[73] Assignee: Mitsubishi Denki Kabushiki Kaisha, Tokyo, Japan

[21] Appl. No.: 629,147

[22] Filed: Apr. 8, 1996

[30] Foreign Application Priority Data

Apr. 24, 1995 [JP] Japan ................................. 7-098760

[51] Int. Cl.⁶ ................................................. H01F 38/12
[52] U.S. Cl. ................................................. 123/647
[58] Field of Search ................................. 123/634, 647

[56] References Cited

U.S. PATENT DOCUMENTS 4,248,201  2/1981  Tsutsui et al. ........................ 123/647

FOREIGN PATENT DOCUMENTS 54-65224  5/1979  Japan .................................. 123/647
6-2658    1/1994  Japan .

*Primary Examiner*—Tony M. Argenbright
*Attorney, Agent, or Firm*—Sughrue, Mion, Zinn, Macpeak & Seas

[57] ABSTRACT

An ignition apparatus for an internal combustion engine has an ignition coil 4,5 disposed within an electrically insulating case 1, and a power switch 6 disposed within the case and comprising a switching unit 8, 9 for intermittently supplying a primary current to the ignition coil. A gel 12 is disposed over the switching unit and at least one electrical wire conductor 21 having one end connected to the switching unit and the other end extending outwardly of the power switch. An electrically insulating resin 14 fills the insulating case, and supports/covers the ignition coil and the power switch. The electrical wire conductor includes a flexible bent portion 21a disposed within the gel for absorbing any tension in the conductor. With this arrangement, a heat shock resistant performance of the wire conductor is improved and working reliability is also improved.

11 Claims, 7 Drawing Sheets

IGNITION APPARATUS FOR INTERNAL COMBUSTION ENGINE

BACKGROUND OF THE INVENTION

1. Field of the Invention

The present invention relates to an ignition apparatus for an internal combustion engine having a power switch for intermittently feeding a primary current to an ignition coil, the power switch being contained in an insulating case and fixed therein by an insulating resin material poured into the insulating case.

2. Description of the Related Art

FIG. 6 is a partial cross sectional view of a conventional ignition apparatus for an internal combustion engine, FIG. 7 is an overall perspective view of an insulating case and FIG. 8 is an electric circuit diagram of the ignition apparatus for the internal combustion engine. In the drawings, a hole (not shown) is defined at the center of bottom of the accommodating portion 1a of a synthetic resin insulating case 1. A first E-shaped iron core 2 of an ignition coil passes through the hole at the central portion thereof. A second E-shaped iron cone 3 of the ignition coil is spaced apart from the first E-shaped iron core 2. A primary coil 4 is wound around the central portion of the first E-shaped iron core 2 and the central portion of the second E-shaped iron core 3 spaced apart from the first E-shaped iron core in confrontation therewith. A secondary coil 5 is wound around the outer periphery of the primary coil 4.

A power switch 6 is accommodated in an auxiliary accommodating portion 1c projecting from the accommodating portion 1a. The power switch 6 includes a tray shaped copper heat sink 7, a switching device 8 which is a power transistor accommodated in the heat sink 7, a hybrid integrated circuit (hybrid IC) 9 for driving and controlling the switching device 8, a electrical wire conductor 10 for connecting the switching device 8 to the hybrid integrated circuit 9, a wire conductor 11 having an end connected to the hybrid integrated circuit 9 and a silicone gel 12 filled into the heat sink 7 for protecting a switching unit composed of the switching device 8 and the hybrid integrated circuit 9.

The insulating case 1 includes a holding portion 1d for a high-tension terminal as the high-tension unit of an ignition coil (not shown) and a holding portion 1e for a low-tension terminal unit. The low-tension terminal unit includes a VB terminal 13a for connecting the primary coil to the battery of an automobile, an ignition signal input terminal 13b for imposing an ignition signal from a control unit (not shown) to the power switch 6 and a ground terminal 13c.

In the ignition apparatus for the internal combustion engine arranged as described above, the power switch 6 having the heat sink 7 into which the silicone gel 12 is filled is accommodated in the auxiliary accommodating portion 1c and then the extreme end of the wire conductor 11 is connected to the terminals 13b, 13c as well as the power switch 6 is connected to the primary coil 4 through the wire conductor 15. Thereafter, the accommodating portion 1a and auxiliary accommodating portion 1c of the insulating case 1 is filled with an electrically insulating resin 14 and the insulating resin 14 is cured so as to fix the power switch 6 in the insulating case 1.

With this arrangement, a primary current flowing to the primary coil 4 of the ignition coil is controlled through the power switch 6 in response to an ignition signal input from an ignition signal input terminal 13b. A high-tension voltage is produced to the secondary coil 5 of the ignition coil in response to the primary current flowing to the primary coil 4 and fed to a distributor (not shown) through the high-tension terminal.

In the conventional ignition apparatus for the internal combustion engine, the insulating resin 14 is repeatedly expanded and contracted by the effect of the heat produced in the secondary coil 5 and the switching device 8 by the intermittent operation of the power switch 6, by which tension is applied to the wire conductors 11 and 15. As a result, the bonded portion 11a of the wire conductor 11 is exfoliated from the hybrid integrated circuit 9, for example, whereby a problem arises in a heat shock resistant performance.

Likewise, there is also a problem that when a job for assembling the power switch 6 into the insulating case 1 or connecting the wire conductor 11 is carried out, stress such as tension or the like is applied to the wire conductor 11, so that the bonded portion 11a of the wire conductor 11 is exfoliated from the hybrid integrated circuit 9, and working reliability is lost.

Further, there is a problem that when the insulating resin 14 is poured into the insulating case 1 in vacuum, air contained in the silicone gel 12 moves into the insulating resin 14 to form voids in the insulating resin 14 so that the insulating performance of the insulating resin 14 is deteriorated.

SUMMARY OF THE INVENTION

An object of the present invention made to solve the above problems is to provide an ignition apparatus for an internal combustion engine in which a heat resistance property of wire conductors is improved, working reliability is improved and an insulating performance is also improved.

An ignition apparatus for an internal combustion engine of the present invention comprises: an electrically insulating case; an ignition coil disposed within the insulating case; a power switch disposed within the insulating case and comprising a switching unit for intermittently supplying a primary current to the ignition coil, a gel disposed over said switching unit for covering the switching unit and at least one electrical wire conductor having one end connected to the switching unit and the other end extending outwardly of the power switch; and an electrically insulating resin disposed within the insulating case and supporting and covering the ignition coil and the power switch within the insulating case; the electrical wire conductor including a flexible bent portion disposed within the gel for absorbing a tension in the electrical wire conductor.

Further, an ignition apparatus for an internal combustion engine comprises: an electrically insulating case; an ignition coil disposed within the insulating case; a power switch disposed within the insulating case and comprising a switching unit for intermittently supplying a primary current to the ignition coil, a heat sink for supporting the switching unit, a gel disposed on the heat sink over the switching unit for covering the switching unit, an electrical wire conductor having one end connected to the switching unit and the other end extending outwardly of the power switch and an electrically insulating support member secured to the heat sink and supporting the wire conductor; and an electrically insulating resin disposed within the insulating case and supporting and covering the ignition coil and the power switch within the insulating case.

DESCRIPTION OF THE PREFERRED EMBODIMENTS

Embodiment 1

Figure 1:
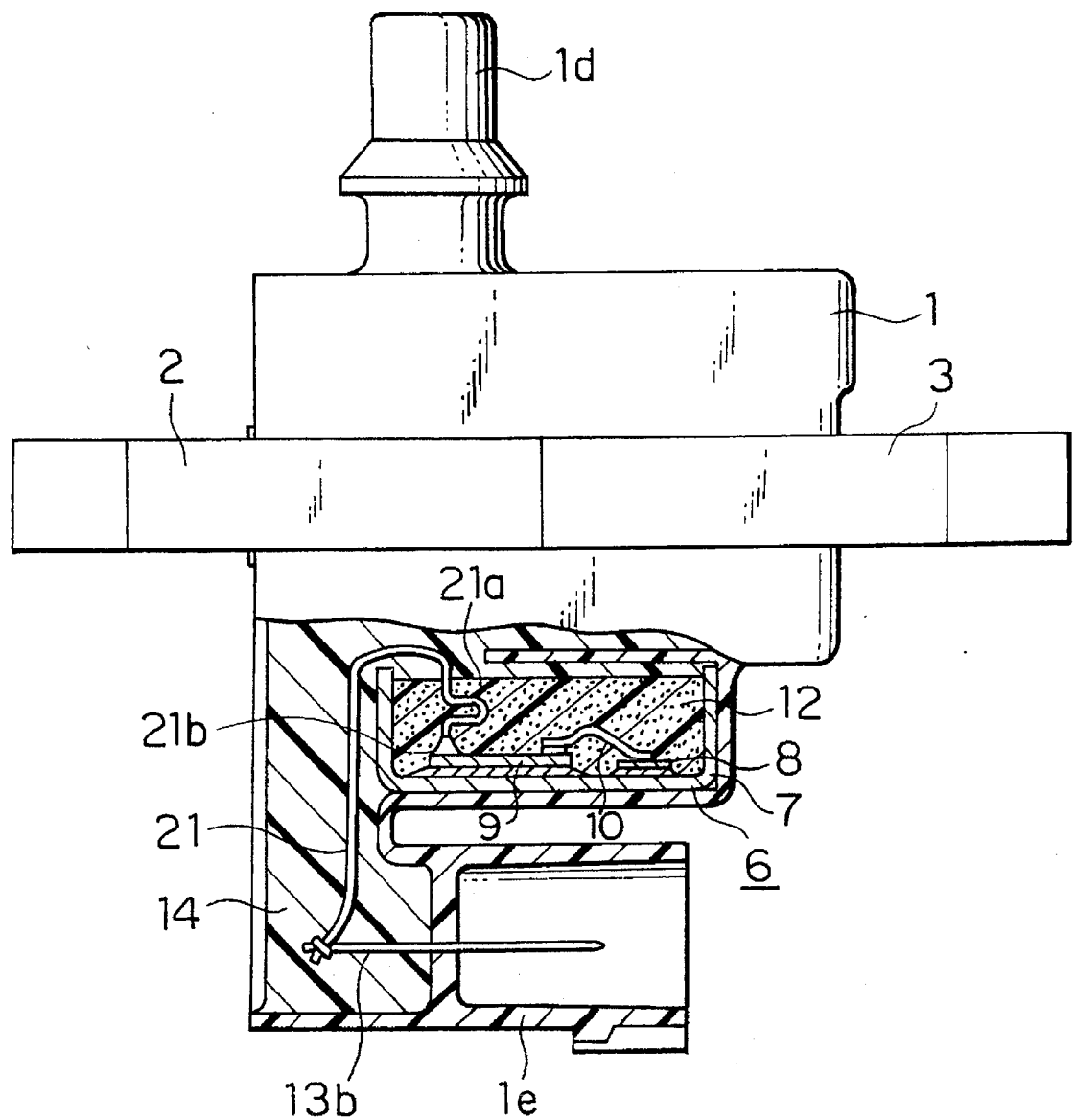
FIG. 1 is a sectional front view of an embodiment of an an ignition apparatus for an internal combustion engine according to the present invention.
Figure 6:
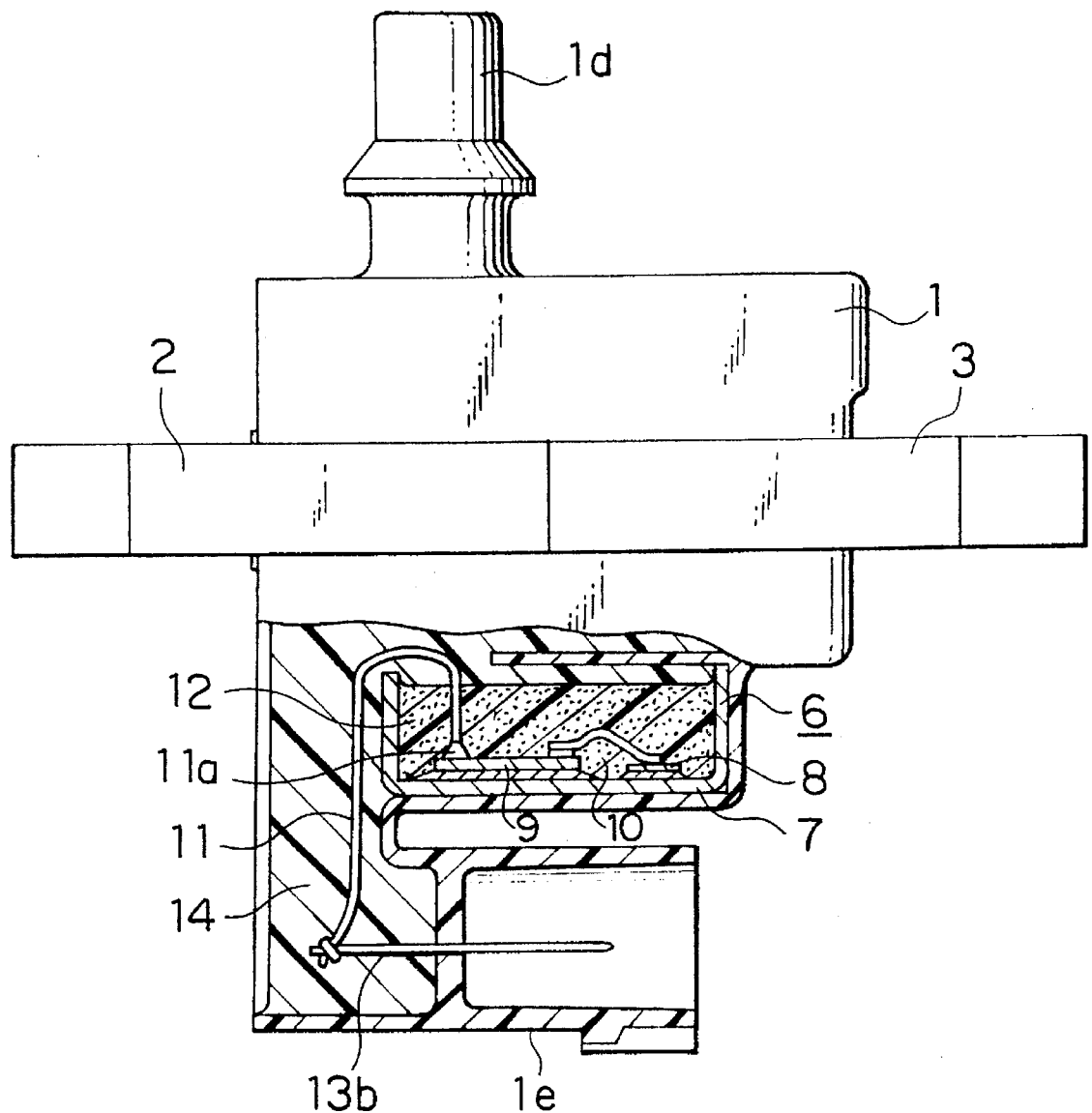
FIG. 6 is a sectional front view of the conventional ignition apparatus for the internal combustion engine according to the present invention.
Figure 7:
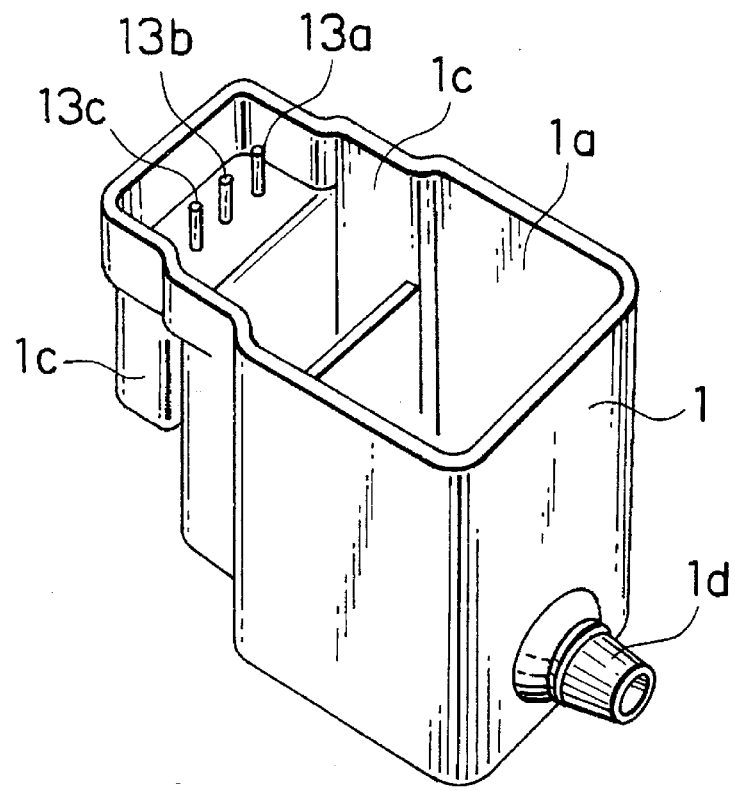
FIG. 7 is a perspective view of an insulating case of FIG. 6.
Figure 8:
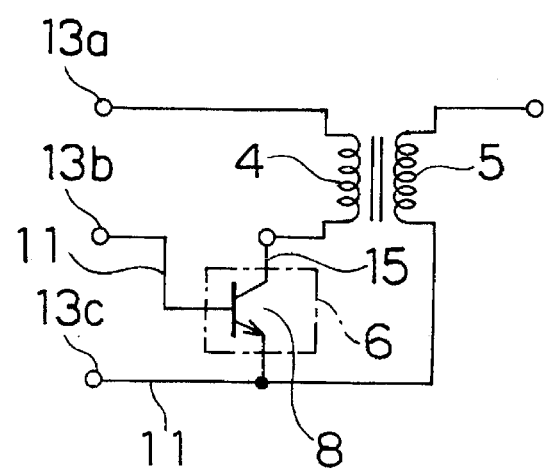
FIG. 8 is an electric circuit diagram of the conventional ignition apparatus for the internal combustion engine.

Embodiments of the present invention will be described below with reference to the drawings. FIG. 1 is a partial front cross sectional view showing an embodiment of an ignition apparatus for an internal combustion engine according to the present invention, wherein the same numerals as used in FIG. 6 to FIG. 8 are used to denote the same or corresponding parts and the description thereof will be omitted.

In this ignition apparatus for an internal combustion engine, each of wire conductors 21, each having an end connected to the hybrid integrated circuit 9 as contorol element and the other end connected to the ignition signal input terminal 13b, has a bent portion 21a in the silicone gel 12.

Therefore, even if an insulating resin 14 is expanded and contracted by the effect of the heat of the secondary coil 5 and the switching device 8 and tension is produced to the wire conductor 21, the tension is absorbed by the bent portion 21a and is not applied to a bonded portion 21b of the wire conductor 21.

Embodiment 2

Figure 2:
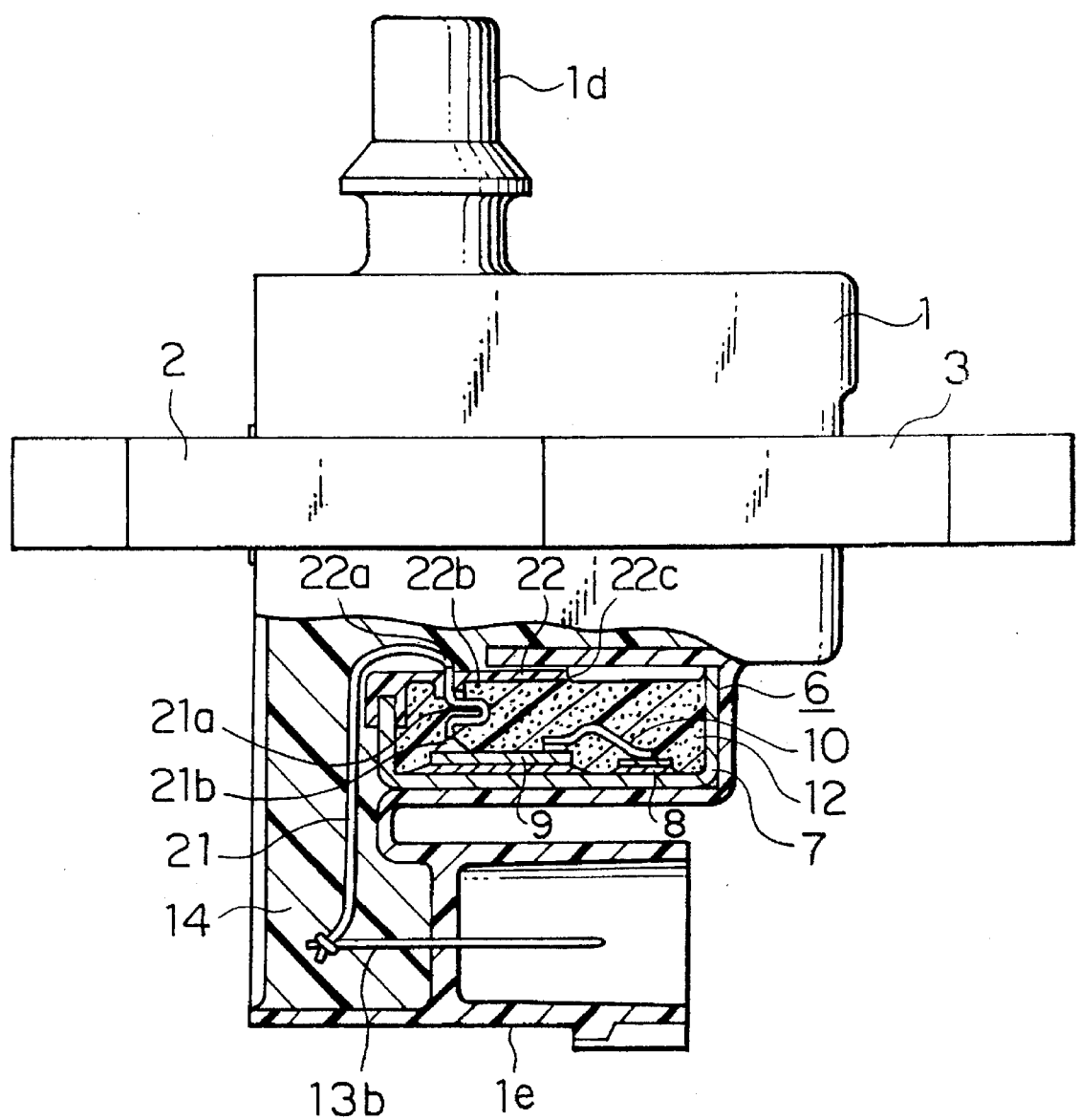
FIG. 2 is a sectional front view of another embodiment of the ignition apparatus for the internal combustion engine according to the present invention.

FIG. 2 is a partial sectional view showing another embodiment of the ignition apparatus for the internal combustion engine according to the present invention, wherein the heat sink 7 is covered with a plate 22 as positioning means which positions the bent portion 21b in the silicone gel 12. The plate 22 includes a hole 22a through which the wire conductor 21 having the bent portion 21a passes, a projection 22b for positioning the bent portion 21a and a gel window 22c through which the silicone gel 12 is filled.

When the heat sink 7 is to be filled with the silicone gel 12, the plate 22 is mounted to the heat sink 7, so that, when the heat sink 7 is filled with the silicone gel 12 through the gel window 22c, the bent portion 21a is also securely positioned in the heat sink 7 by the projection 22b and buried in the silicone gel 12. Therefore, the bent portion 21a is ensured to be buried in the gel 12 and not in the insulating resin 14. Therefore, even if tension is produced in the wire conductor 21 by the expansion or contraction of the insulating resin 14, the tension is securely absorbed by the bent portion 21a in the silicone gel 12 and is not applied to the bonded portion 21b of the wire conductor 21.

Embodiment 3

Figure 3:
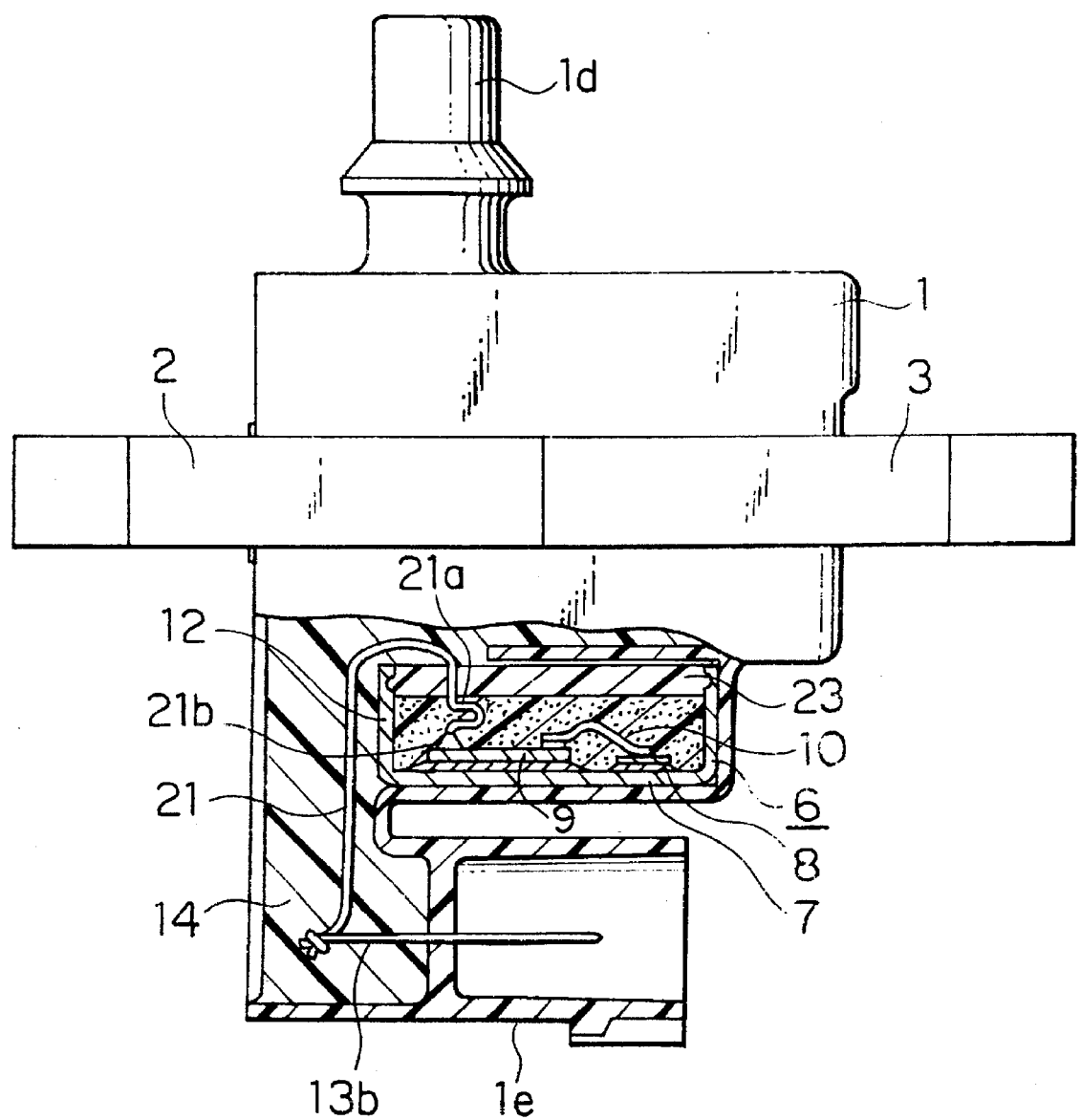
FIG. 3 is a sectional front view of another embodiment of the ignition apparatus for the internal combustion engine according to the present invention.

FIG. 3 is a sectional view showing still another embodiment of the ignition apparatus for internal combustion engine according to the present invention, wherein a rigid resin cover 23 is disposed on the silicone gel 12 in which the bent portion 21a of the wire conductor 21 is buried. The resin cover 23 is arranged such that a resin such as an epoxy resin or the like which has a good intimate contact property with and hermetically attached to the wire conductor 21 and the heat sink 7 is filled and cured on the silicone gel 12 to hermetically cover the gel 12.

In this embodiment, the wire conductor 21 of the power switch 6 is in intimate contact with the resin cover 23 and fixed thereto when the power switch 6 is to be accommodated in an auxiliary accommodating portion 1c (see FIG. 7). Therefore, even if tension is applied to the wire conductor 21 when the extreme end of the wire conductor 21 is connected to the ignition signal input terminal 13b, the tension is not applied to the bonded portion 21b of the wire conductor 21 because the wire conductor 21 is fixed by the resin cover 23.

Further, since the bent portion 21a is buried in the silicone gel 12, even if the insulating resin 14 and the resin cover 23, which may be the same material or which may have the simular thermal coefficient of expansion, are expanded and contracted by the effect of the heat produced by the secondary coil 5 and the switching device 8 and as a result tension is produced to the wire conductor 21, the tension is absorbed by a bent portion 21a in the silicone gel 12 and is not applied to the bonded portion 21b of the wire conductor 21.

Further, since the silicone gel 12 is covered with the resin cover 23, air remaining in the silicone gel 12 is confined in the heat sink 7. Thus, when the insulating resin 14 is poured into an insulating case 1 in vacuum, there is not caused such a phenomenon that the air remaining in the silicone gel 12 moves into the insulating resin 14 and forms voids to thereby lower an electrically insulating performance.

Embodiment 4

Figure 4:
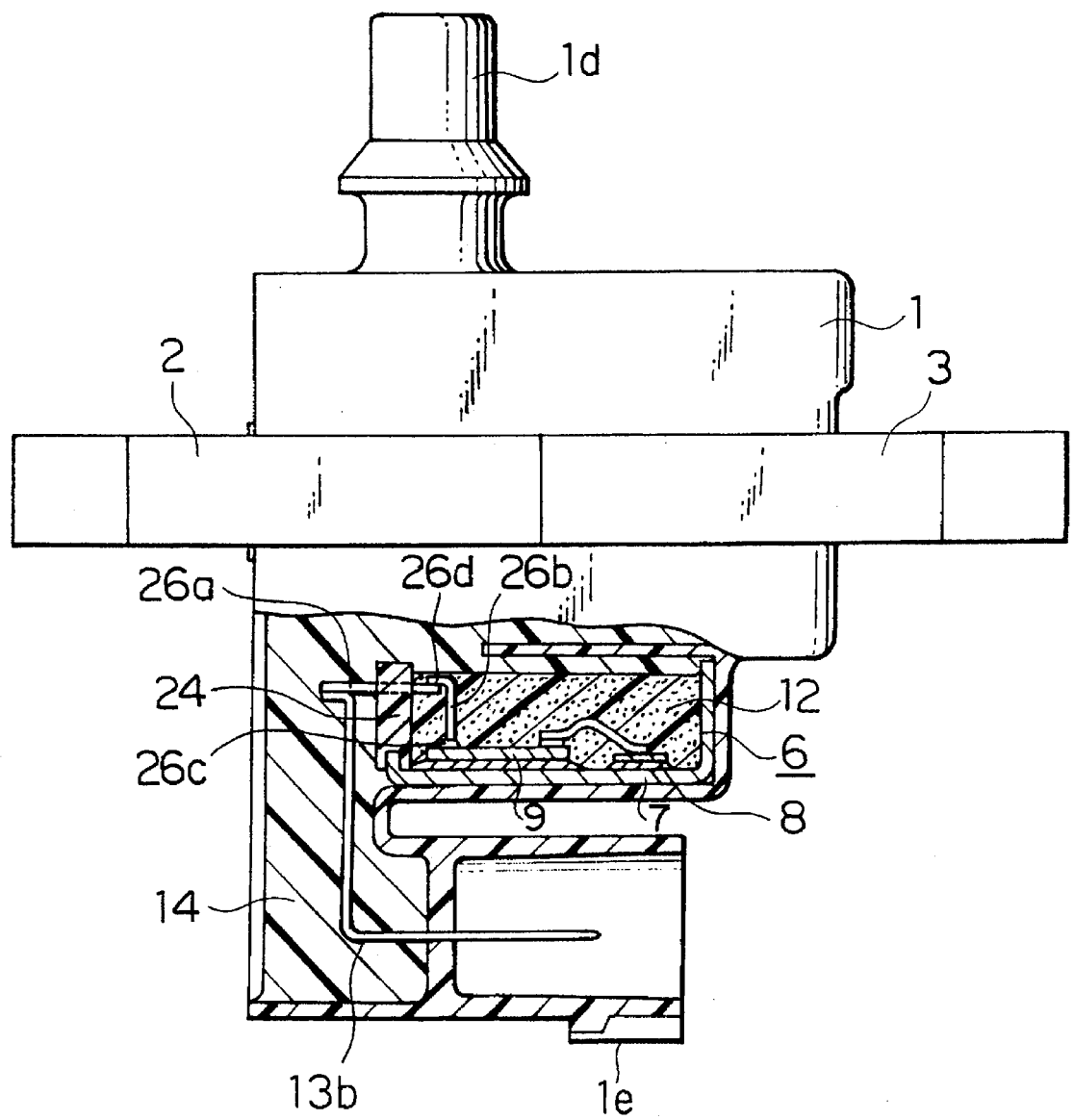
FIG. 4 is a sectional front view of another embodiment of the ignition apparatus for the internal combustion engine according to the present invention.

FIG. 4 is a sectional view showing another embodiment of the ignition apparatus for the internal combustion engine according to the present invention, wherein an insulating support member 24 is disposed on a side of the heat sink 7. A first wire section 26a extends through and is fixed to the insulating support member 24 which constitutes a portion of a vessel together with the heat sink 7. The ignition signal input terminal 13b is connected to an end of the first wire section 26a. The other end of the first wire section 26a is connected to the extreme end of a second wire section 26b in the silicone gel 12. The base end of the second wire section 26b is connected to the hybrid integrated circuit 9 as a control unit at a bonded portion 26c.

In this embodiment, the power switch 6 having the insulating support member 24 to which the first wire section 26a is fixed is accommodated in an auxiliary accommodating portion 1c (FIG. 7) and then the first wire section 26a is connected the ignition signal input terminal 13b. Thus, even if stress is applied to the first wire section 26a during the assembly and wiring processes of the power switch 6, the stress is received and supported by the insulating support member 24 and is not transmitted to the second wire portion 26b. Therefore, the second wire portion 26b is not exfoliated at the bonded portion 26c.

During operation, although stresses such as tension or the like are applied to the first wire section 26a by the insulating resin 14 which is expanded and contracted by the effect of the heat of the second coil 5 and the switching device 8, the stress is also supported by the insulating support member 24 and is not transmitted to the second wire portion 26b. Further, since the second wire section 26b is positioned in the silicone gel 12 and does not receive the effect of expansion and contraction of the insulating resin 14, the second wire section 26b is not exfoliated from the hybrid integrated circuit 9 at the bonded portion 26c.

Embodiment 5

Figure 5:
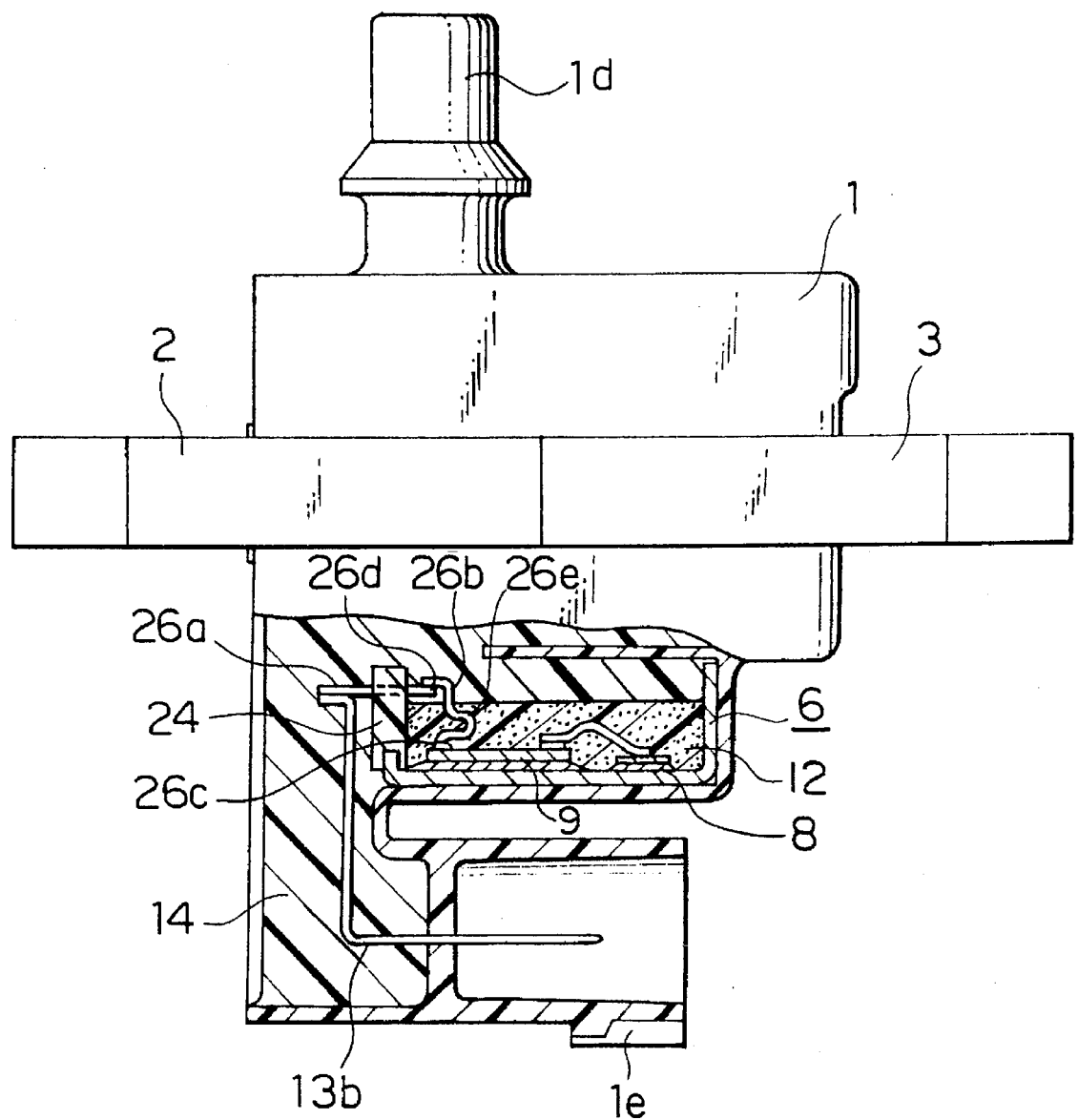
FIG. 5 is a sectional front view of another embodiment of the ignition apparatus for the internal combustion engine according to the present invention.

FIG. 5 is a partial sectional view showing still another embodiment of the ignition apparatus for the internal combustion engine according to the present invention. This embodiment is different from the embodiment 4 in that the connecting portion 26d where the first wire section 26a is connected to the second wire section 26b is positioned in the insulating resin 14 located outside of the silicone gel 12 and the bent portion 26e of the second wire portion 26b is positioned in the silicone gel 12.

In the case of the aforesaid embodiment 4, since the connecting portion 26d where the first wire section 26a is connected to the second connecting portion 26b is positioned in the silicone gel 12, there is an advantage that the second wire section 26b does not receive the effect of expansion and contraction of the insulating resin 14. However, in the embodiment 4, a vessel must be filled with the silicone gel 12 after the first wire section 26a is soldered to the second wire section 26b. As a result, there is a fear that the switching device 8 and the hybrid integrated circuit 9 as control element are adversely affected by solder dusts produced during soldering.

In the embodiment 5, however, since the connecting portion 26d is positioned outside of the silicone gel 12, the first wire portion 26a can be soldered to the second wire portion 26b after a vessel is filled with the silicone gel 12. Consequently, the switching device 8 and the hybrid integrated circuit 9 can be protected from solder dusts produced by a soldering job.

Further, even if the insulating resin material 14 is expanded and contracted by the effect of heat produced by a secondary coil 5 and a switching element 8 and as a result tension is produced to the second wire portion 26b, the tension can be absorbed by the bent portion 26e in the silicone gel 12, thus the second wire portion 26b is not exfoliated from the hybrid integrated circuit 9 at the bonded portion 26c.

Although the present invention has been described in connection with the wire conductors 21 (FIGS. 1 to 3), 26a and 26b (FIGS. 4 and 5) for connecting the power switch 6 to the ignition signal input terminal 13b (see FIG. 8), it is needless to say that the present invention is also applicable to the wire conductor 11 (see FIG. 8) for connecting the power switch 6 to the ground terminal 13c (see FIG. 8) and the wire conductor 15 (see FIG. 8) for connecting the power switch 6 to the primary coil 4 (see FIG. 8).

What is claimed is:

1. An ignition apparatus for an internal combustion engine comprising:

an electrically insulating case;

an ignition coil disposed within said insulating case;

a power switch disposed within said insulating case and comprising a switching unit for intermittently supplying a primary current to said ignition coil, a gel disposed over said switching unit for covering said switching unit and at least one electrical wire conductor having one end connected to said switching unit and the other end extending outwardly of said power switch; and an electrically insulating resin disposed within said insulating case and supporting and covering said ignition coil and said power switch within said insulating case;

said electrical wire conductor including a flexible bent portion disposed within said gel for absorbing a tension in said electrical wire conductor.

2. An ignition apparatus for an internal combustion engine as claimed in claim 1, wherein said power switch further comprises a heat sink to which said switching unit is attached.

3. An ignition apparatus for an internal combustion engine as claimed in claim 2, wherein said heat sink is in the shape of a tray.

4. An ignition apparatus for an internal combustion engine as claimed in claim 2, wherein said power switch comprises an electrically insulating positioning means attached to said heat sink for positioning said bent portion of said electrical wire conductor within said gel.

5. An ignition apparatus for an internal combustion engine as claimed in claim 4, wherein said heat sink is in the shape of a tray and said positioning means comprises a plate attached to said heat sink for at least partially covering said gel within said heat sink, said wire conductor extending through said plate which engages said bent portion of said wire conductor.

6. An ignition apparatus for an internal combustion engine as claimed in claim 2, further comprising a rigid resin cover hermetically attached to said heat sink and said wire conductor and hermetically covering said gel within said heat sink.

7. An ignition apparatus for an internal combustion engine comprising:

an electrically insulating case;

an ignition coil disposed within said insulating case;

a power switch disposed within said insulating case and comprising a switching unit for intermittently supplying a primary current to said ignition coil, a heat sink for supporting said switching unit, a gel disposed on said heat sink over said switching unit for covering said switching unit, an electrical wire conductor having one end connected to said switching unit and the other end extending outwardly of said power switch and an electrically insulating support member secured to said heat sink and supporting said wire conductor; and an electrically insulating resin disposed within said insulating case and supporting and covering said ignition coil and said power switch within said insulating case.

8. An ignition apparatus for an internal combustion engine as claimed in claim 7, wherein said electrical wire conductor comprises a first section secured to said insulating support member and having one end extending into said gel and the other end extending outwardly of said gel and a second section connected at one end to said switching unit and at the other end to said one end of said first section.

9. An ignition apparatus for an internal combustion engine as claimed in claim 8, wherein said electrical wire conductor further comprises a terminal section having one end connected to said the other end of said first section and the other end outwardly extending through said insulating case for an external connection.

10. An ignition apparatus for an internal combustion engine as claimed in claim 8, wherein said second section of said wire conductor includes a flexible bent portion disposed within said gel for absorbing a tension in said electrical wire conductor.

11. An ignition apparatus for an internal combustion engine as claimed in claim 8, wherein said first and second sections of said wire conductor are connected at a position outside of said gel.

* * * * *